United States Patent [19]

Sparks

[11] Patent Number: 4,732,874
[45] Date of Patent: Mar. 22, 1988

[54] REMOVING METAL PRECIPITATES FROM SEMICONDUCTOR DEVICES

[75] Inventor: Douglas R. Sparks, Kokomo, Ind.

[73] Assignee: Delco Electronics Corporation, Kokomo, Ind.

[21] Appl. No.: 919,324

[22] Filed: Oct. 15, 1986

[51] Int. Cl.$^4$ .................. H01L 21/225; H01L 21/265
[52] U.S. Cl. ..................................... 437/247; 357/64; 420/490; 437/31; 437/154; 437/939; 437/942
[58] Field of Search ........................ 148/1.5, 175, 187; 29/576 B, 576 T; 357/64

[56] References Cited

U.S. PATENT DOCUMENTS 4,181,538  1/1980  Narayan et al. .................. 148/1.5
4,416,051 11/1983  Thomas et al. .................. 148/1.5
4,521,256  6/1985  Hiraki et al. .................... 148/1.5

OTHER PUBLICATIONS

Kato et al, Jour. Electrochem. Soc. 131 (1984), 1145.
Baeri et al, Phys. Rev. Letts. 41 (1978), 1246.
Sparks et al, Jour. Electrochem. Soc. 133 (1986), 1201.
Kwor et al, Ibid, 132 (1985), 1201.
Jones, Jr. et al, Jour. Appl. Phys. 57 (1985), 2802.
Tung, Jour. Electrochem. Soc. 132 (1985), 914.
Sinke et al, Phys. Res. Letts. 53 (1984), 2121.
Langouche et al, Phys. Res. Letts. 53 (1984), 1364.
Kishino et al, Jap. Jour. Appl. Phys. 19 (1980), L-466.
L. C. Brown, "Shape Changes during Dissolution of O-CuAl$_2$", Metallurgical Transactions A, vol. 15A, pp. 449-458, Mar. 1984.
K. K. Sagoe-Crentsil and L. C. Brown, "Dissolution Kinetics of Widmanstatten y-Ag$_2$Al Precipitates," Metallurgical Transactions A, vol. 15A, Nov. 1984-1969.
D. R. Sparks, "Dissolution of Transition Metal Precipitates in Silicon," submitted for publication, Appl. Phys. Let. (1986).
P. Augustus, "Detection of Fe and Ni Surface Precipitates by TEM," Semiconductor International, pp. 88-91, Nov. 1985.
N. Natsuaki et al., "Rapid-Thermal Annealing of a Polysilicon-Stacked Emitter Structure," Proc. IEEE Int'l. Elect. Dev. Meeting, pp. 662-665 (1983).
S. N. G. Chu et al., Proc. of the Fall 1985 Meeting of the Electrochemical Society, Paper #540 (1985).
S. S. Gill, B. J. Sealy, ibid., Paper #566.
T. H. Yu et al., ibid., Paper #567.
P. E. Thompson, H. B. Dietrich, ibid., Paper #568.
Wilson et al., "Rapid Annealing Technology for Future VLSI," Solid State Technology, pp. 185-190 (Jun. 1985).
D. R. Sparks, "Metal Precipitate Dissolution in Semiconductors by Rapid Thermal Processing," submitted for publication.

Primary Examiner—Upendra Roy
Attorney, Agent, or Firm—Robert J. Wallace

[57] ABSTRACT

Rapid thermal annealing, involving rapid heating to a temperature of between 550 degrees C. and 750 degree C. for between 30 and 90 seconds and rapid cooling, is used to dissolve the precipitates of transition metals which tend to occur in a silicon wafer and to keep such metals in solution after cooling. Such annealing can be used in the manufacture of bipolar transistors to limit the emitter-collector shorting caused by metallic precipitates. It is also useful more generally to improve the leakage current of p-n junctions either in diodes or as parts of bipolar or field-effect transistors.

9 Claims, 1 Drawing Figure

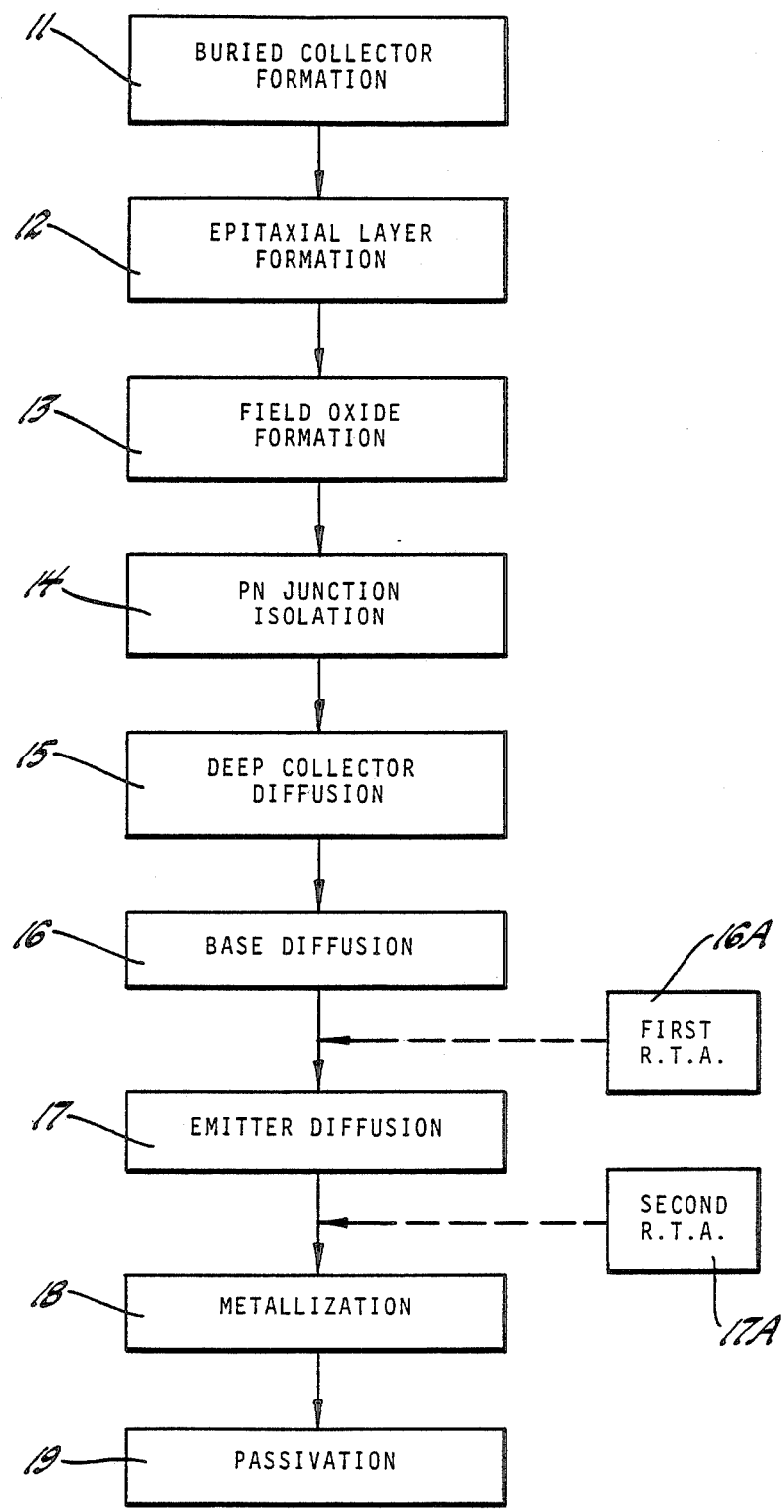

REMOVING METAL PRECIPITATES FROM SEMICONDUCTOR DEVICES

FIELD OF THE INVENTION

This invention relates to the fabrication of semiconductive devices, particularly silicon integrated circuit devices.

BACKGROUND OF THE INVENTION

The increasing density with the resulting finer design rules of semiconductive elements in integrated circuit devices increases the susceptibility of the devices to impurities which deleteriously affect the properties of the devices. Of particular concern are metallic precipitates in the silicon wafer in which the circuit is formed. Such precipitates can cause emitter-collector shorting in bipolar transistors, source-drain shorting in MOS transistors and a softening of the reverse breakdown characteristic of junction diodes.

While gettering techniques are available for elimination of undesired impurities in the silicon bulk, such techniques have limitations. Additionally, in some instances, such impurities (typically gold) are useful in solution in the silicon, for example, for reducing the lifetime of minority carriers in the base of bipolar switching transistors operated in saturation. The gold doping effectively improves the switching time of the transistor. In such a device it is important to keep the metal in solution in the silicon rather than as precipitates capable of forming conductive shorts (pipes). Additionally, it is desirable to be able to remove metallic precipitates from semiconductor wafers which have already had diodes and/or transistors and possible other circuitry fabricated therein and thereby to improve the quality of the p-n junctions included and to limit undesired shorting of components.

SUMMARY OF THE INVENTION

It has been been discovered that metal precipitates, particularly of transition metals, such as iron, copper, nickel, chromium and gold, which are of particular interest in silicon semiconductor technology, can be dissolved and kept in solution by appropriate rapid thermal annealing (RTA). Particularly useful has been found annealing in which the temperature is raised to between 550 degrees C. and 750 degrees C. in a few seconds, kept at such temperature for tens of seconds, and cooled rapidly so that the dissolved metal atoms are quenched in solution because there is insufficient time for the metal atoms to reform into precipitates. Such treatment is to be distinguished from the rapid thermal annealing used to activate implanted ions, which generally involves higher temperatures and/or longer cooling times, and which tend to result in reforming of the precipitate by the time the wafer is restored to room temperature, even though dissolution may have occurred earlier in the cycle.

The invention is of special interest in the manufacture of bipolar junction transistors, in which two novel annealing steps are included, the first after formation of the diffused base zone, and the second after formation of the diffused emitter zone. After such second annealing step, processing which might cause the transition metals to reprecipitate is avoided.

The present invention is better understood by considering the following detailed description taken in conjunction with the accompanying drawing.

BRIEF DESCRIPTION OF THE DRAWING

The FIGURE shows in block diagram form a method in accordance with the present invention for forming a diffused-base epitaxial transistor.

DETAILED DESCRIPTION

The invention will be discussed specifically with reference to the fabrication of a conventional diffused base epitaxial bipolar n-p-n silicon junction transistor for use in an integrated circuit although the invention is not intended to be limited to such fabrication. In such transistors designed especially for use in switching circuits, it is advantageous to include in solution in the silicon a metal such as nickel, copper or gold, which serves to reduce the lifetime of minority carriers, to thereby decrease carrier lifetime storage effect in the transistor to improve turn-off times and thereby achieve faster switching speeds.

In the FIGURE, there is shown with solid lines interconnecting the various steps, the conventional process for fabricating a transistor and is shown the novel steps characteristic of the present invention connected by dashed lines.

Typically, in such a process there is first prepared a wafer of relatively high resistivity p-type conductivity silicon. Then as step 11 localized n-type conductivity regions of relatively low resistivity are formed on the active or front major surface of the wafer to serve as buried collectors of the various transistors to be formed in the wafer. This can be done by either of two well known techniques, ion implantation or solid-vapor diffusion. Thereafter, as step 12 an epitaxial n-type layer of relatively high resistivity is formed over the front face of the wafer into which will subsequently be formed the base and emitter zones of each transistor. However, before this is done, as step 13 a relatively thick field oxide layer is deposited over the epitaxial layer and patterned to open the portions where the individual transistors are to be formed. Next as step 14 deep p-type isolation zones are formed to isolate each transistor from its neighboring transistors of the integrated circuit. This is followed as step 15 by a deep n-type diffusions over localized buried collector regions to permit low resistance connections to be made to such buried collector regions. This in turn is followed as step 16 by the forming of a p-type diffused base zone over a portion of each buried collector zone. The depth of this base diffusion is controlled to be less than the depth of the buried collector zone so as to leave a region of relatively high resistivity between the p-type base zone and the low resistivity n-type buried collector zone. This diffusion typically utilizes boron nitride as a solid source of the boron diffusant.

The various steps described hitherto generally involve heating of the wafer to the 1000 degrees C. to 1150 degrees C. temperature range and precipitates of various metals, such as copper and iron, generally present, although not necessarily deliberately so, tend to form in the silicon wafer.

However, hitherto it has been the usual practice to ignore such precipitates and proceed with the formation of the diffused emitter zones within the diffused base zones as step 17. This typically involves the formation of a thermally grown oxide layer over the front surface of the wafer and patterning the layer by etching after providing a mask over the layer. Donor atoms are then diffused into exposed regions of the front surface of the silicon wafer to form the emitter zone. Typically, this step involves liquid phosphorus as the source of the donor diffusant.

Next, as metalization step 18 the typical process involves the deposition over the active surface of an aluminum-rich metal layer which is patterned to provide the desired metalization pattern. Then, it is normal practice to deposit as step 19 a passivation layer of silicon nitride over the front surface to protect the front surface of the wafer.

Finally, the passivation layer is opened to permit connection of leads to the emitter, base and collector metalizations.

The present invention improves on this basic process by the introduction of novel annealing steps advantageously at particular stages of the processing.

First, as step 16A a rapid thermal annealing step is introduced after the formation of the diffused base region to dissolve the precipitates which have formed during the earlier higher temperature processing. Such precipitates, if left undissolved, tend to cause pitting of the surface region where the emitter diffusion is to occur in the course of exposing this surface region by etching away the thermally grown oxide layer which serves as the mask to control such diffusion.

It has been found that such dissolution is readily effected by heating the wafer rapidly, typically between five and ten seconds, from room temperature to above 500 degrees C. preferably in the range between 550 degrees C. and 750 degrees C., holding such temperature for at least thirty seconds, and preferable between thirty and ninety seconds, and then rapidly cooling the wafer to quench the metal atoms in solution before they can reform into a precipitate. Advantageously, this involves rapidly cooling the wafer to below 500 degrees C. and preferably cooling the wafer to room temperature in a few seconds, typically between five and ten seconds.

This first annealing step permits the preparation of a more uniform emitter zone.

Moreover, because the emitter diffusion step itself is normally performed at a temperature close to 1000 degrees C. with relatively slow cooling, it tends to cause some reformation of the precipitates. Accordingly, it is found advantageous to perform as step 17A a similar rapid annealing after the emitter diffusion step 17 and before the metalization step 18.

After such second annealing following the emitter formation, there should be avoided conditions which are apt to lead to reformation of the precipitates. Heating above 500 degrees C., particularly when associated with relatively slow cooling, is apt to cause such reformation and so is advantageously avoided after the second rapid annealing step 17A characteristic of the invention.

In some instances, particularly when nickel is the predominant metal precipitating, it may be preferable to employ multiple, e.g. two or three, relatively shorter heating times, rather than one longer heating cycle, for example, three heating cycles, each of about thirty seconds at 600 degrees C. rather than one at ninety seconds at the same temperature.

The invention should also prove useful when a transition metal impurity, such as gold, is deliberately included in the silicon wafer, for example to reduce the lifetime of minority charge carriers. As mentioned above, the inclusion of such gold to reduce lifetime is advantageous in switching transistors to reduce storage effects and thereby to improve the switching speed of the transistors. For this purpose it is desirable that such gold be in solution in the silicon rather than in precipitate form.

In some instances, backside damage of the wafer also may be introduced to shorten the heating time needed for a desired degree of dissolution, since the damaged lattice tends to more effectively trap impurities and inhibit their diffusion.

It should also be apparent that the invention may be used more broadly to improve the reverse characteristics of a p-n junction by reducing leakage current since precipitates penetrating a junction serve to short the junction. Accordingly, the invention may be used to improve characteristics both of junction diodes themselves and of junctions which form part of bipolar or field-effect devices.

Typical of commercially available equipment which may be used for effecting the desired rapid thermal annealing are the NOVA ROA-400 Automatic Rapid Optical Annealer manufactured by the Eaton Semiconductor Equipment Operations, Ion Implantation Division of Beverly, Mass. and the VEECO/Kokusai DR-500 Cassette-to-Cassette Wafer Annealer.

The embodiments described herein are intended to be illustrative of the general principles of the invention. Various modifications are possible consistent with the spirit of the invention. For example, in some instances it may prove advantageous to use even higher temperatures or longer anneal times than those mentioned for the novel annealing steps, particularly if such steps are used to serve multiple roles. However in such instances it remains important that the cooling conditions be controlled to quench the impurities involved in solution rather than to permit their reformation into precipitates. Further, while the specific example has used vapor-solid diffusion for the formation of the emitter and base zones, either of said zones may be formed by ion implantation with an appropriate drive-in diffusion. Still further, the rapid thermal annealing of the present invention is applicable to the processing of other semiconductor materials such as germanium and compound semiconductors.

The embodiments of the invention in which an exclusive property or privilege is claimed are defined as follows:

1. A process of making a silicon wafer of a silicon device essentially free of transition metal precipitates which comprises the steps of heating the wafer rapidly to a temperature of between 550–750 degrees C., maintaining such temperatures for between 30–90 seconds, rapidly cooling the wafer for quenching the transition metal atoms in solution, and thereafter avoiding conditions in the further processing under which the metal atoms can reform into precipitates.

2. The process of claim 1 in which the wafer is heated to said temperature from room temperature within approximately five to ten seconds and is cooled from said temperature to room temperature within approximately five to ten seconds.

3. The process of claim 1 in which such heating and cooling steps are repeated multiple times in succession.

4. The process of claim 2 in which said temperature is about 600 degrees Centigrade.

5. In the manufacture of a diffused base silicon junction transistor which involves successive base and emitter diffusion steps into a silicon wafer, the improvement which comprises a first rapid thermal annealing step before the emitter diffusion step to dissolve metal precipitates in the silicon wafer, a second rapid thermal annealing step after the emitter diffusion step, and subsequently avoiding heating the wafer under conditions apt to lead to the reformation of the metal precipitates in the silicon wafer.

6. The improvement of claim 5 further characterized in that said rapid annealing steps involve heating the wafer in a few seconds to a temperature between 550 degrees C. and 750 degrees C., holding the wafer at such temperature for between thirty and ninety seconds, and cooling to room temperature in a few seconds.

7. The improvement of claim 5 in which the heating step occurs within approximately five to ten seconds and the cooling step occurs within approximately five to ten seconds.

8. The improvement of claim 5 in the manufacture of a diffused base silicon transistor which includes a silicon wafer which is gold-doped and the improvement is designed to maintain the gold in solution than as precipitates in the silicon.

9. The improvement of claim 7 in which said temperature is about 600 degrees Centigrade.

* * * * *